(12) United States Patent
Chen et al.

(10) Patent No.: US 7,332,447 B2
(45) Date of Patent: Feb. 19, 2008

(54) METHOD OF FORMING A CONTACT

(75) Inventors: Neng-Kuo Chen, Hsinchu (TW);
Teng-Chun Tsai, Hsinchu (TW);
Chien-Chung Huang, Taichung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 77 days.

(21) Appl. No.: 11/164,481

(22) Filed: Nov. 24, 2005

(65) Prior Publication Data

US 2007/0117370 A1    May 24, 2007

(51) Int. Cl.
*H01L 21/469* (2006.01)
*H01L 21/338* (2006.01)

(52) U.S. Cl. ............... 438/791; 438/174; 438/724; 257/E21.293

(58) Field of Classification Search ............ 438/174, 438/724, 791; 257/E21.293
See application file for complete search history.

(56) References Cited

U.S. PATENT DOCUMENTS

| | | | |
|---|---|---|---|
| 6,255,229 B1 * | 7/2001 | Lin et al. ............ | 438/761 |
| 6,261,891 B1 * | 7/2001 | Cheng et al. ........ | 438/238 |
| 6,602,748 B2 * | 8/2003 | Watatani ............. | 438/239 |
| 7,220,630 B2 * | 5/2007 | Cheng et al. ........ | 438/199 |
| 2004/0021160 A1 * | 2/2004 | Eguchi et al. ....... | 257/296 |

* cited by examiner

*Primary Examiner*—Scott B. Geyer
*Assistant Examiner*—Seahvosh Nikmanesh
(74) *Attorney, Agent, or Firm*—Jianq Chyun IP Office (57) ABSTRACT

A method of forming a contact is provided. A substrate having at least two metal oxide semiconductor devices is provided and a gap is formed between the two devices. A first stress layer is formed over the substrate to cover the metal-oxide semiconductor devices and the substrate. The first stress layer is formed by first forming a first stress material layer over the substrate to cover the metal-oxide semiconductor devices and to fill the gap, wherein the stress material inside the gap has a seam. An etching back process is then performed to remove a portion of the stress material layer inside the gap. A second stress layer and a dielectric layer are sequentially formed on the first stress layer. A portion of the second stress layer is removed to form a contact opening. A second conductive layer is filled into the contact opening to form a contact.

11 Claims, 9 Drawing Sheets

METHOD OF FORMING A CONTACT

BACKGROUND OF THE INVENTION

1. Field of the Invention

The present invention relates to an integrated circuit device. More particularly, the present invention relates to a method of forming a contact and a semiconductor device.

2. Description of Related Art

During the development of integrated circuit devices, it has been shown that devices can achieve high speed operation and low electrical consumption through the reduction of the device dimensions. However, the technology in miniaturizing device dimension has approached a technical bottleneck. Further, due to reasons like higher cost, other technology asides from the technology in miniaturizing device dimension, needs to be developed to improve the drive current. People skilled in the art have proposed controlling the stress at the channel region of the transistor to overcome the restraint in size reduction of devices. This method relies on stress to alter the distance of the silicon lattice to enhance the mobility of electrons and holes in order to enhance the efficiency of devices.

One method to enhance the efficiency of devices via the stress control method is the application a silicon nitride layer as a contact etch stop layer to generate stress. The drive current of the device is thereby increased to enhance the efficiency of devices. However, other problems still exist in the abovementioned method in which the efficiency of devices is adversely affected.

FIGS. 1A to 1E are schematic, cross-sectional views showing the steps for fabricating a contact according to the prior art.

Figure 1A:
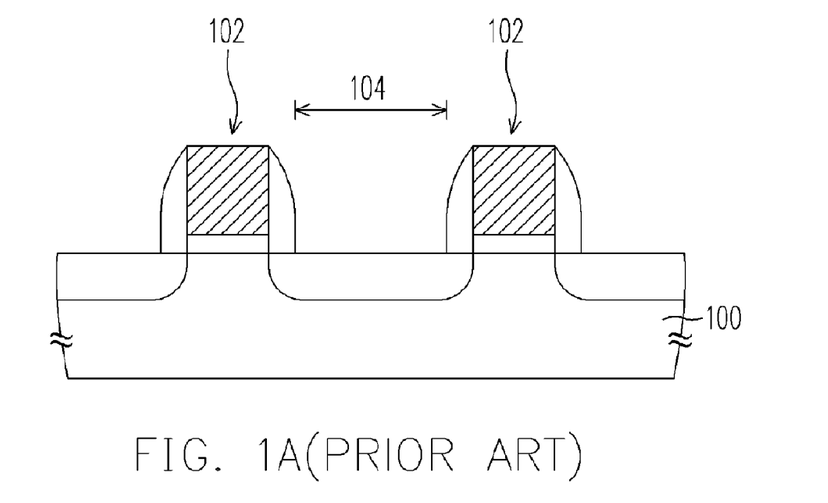
FIGS. 1A to 1E are schematic, cross-sectional views showing the steps for fabricating a contact according to the prior art.

Referring to FIG. 1A, a plurality of metal oxide semiconductor devices 102 is formed on a substrate 100. A gap 104 is present between every two metal oxide semiconductor devices 102.

Figure 1B:
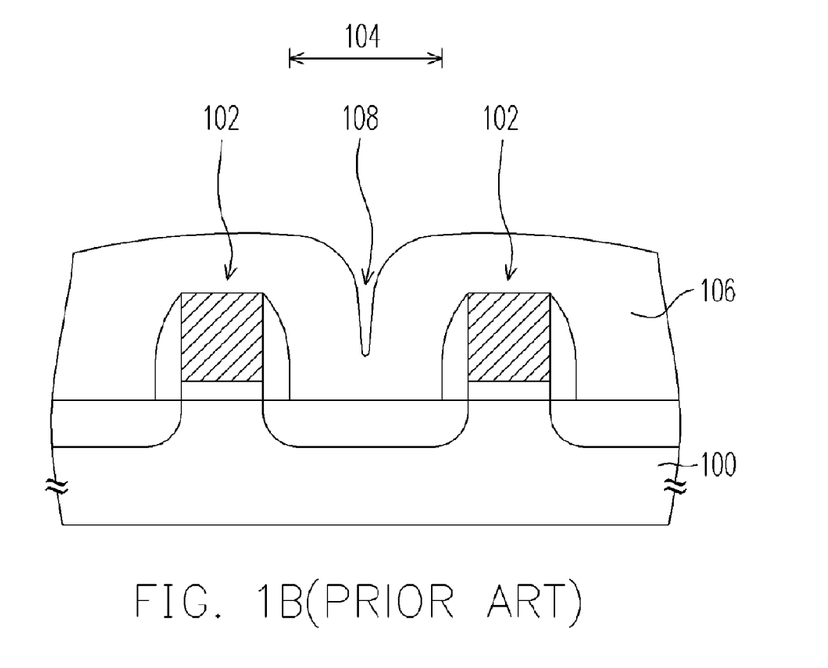

Referring to FIG. 1B, a silicon nitride layer 106 is formed over the substrate 100 as a stress layer, wherein the silicon nitride layer 106 covers the entire substrate 100 and the metal oxide semiconductor devices 102. The thickness of the silicon nitride layer 106 is highly related to its stress value. In other words, the thicker the silicon nitride layer 106, the higher its stress value. However, when a thicker silicon nitride film layer is formed to enhance the device efficiency, seam is generated in the silicon nitride layer 106 inside the gap 104. The reliability of the subsequent process is seriously affected. More particularly, when the level of device integration increases, the gap 104 becomes narrower. Seam and void are even more easily generated in the silicon nitride layer 106.

Figure 1C:
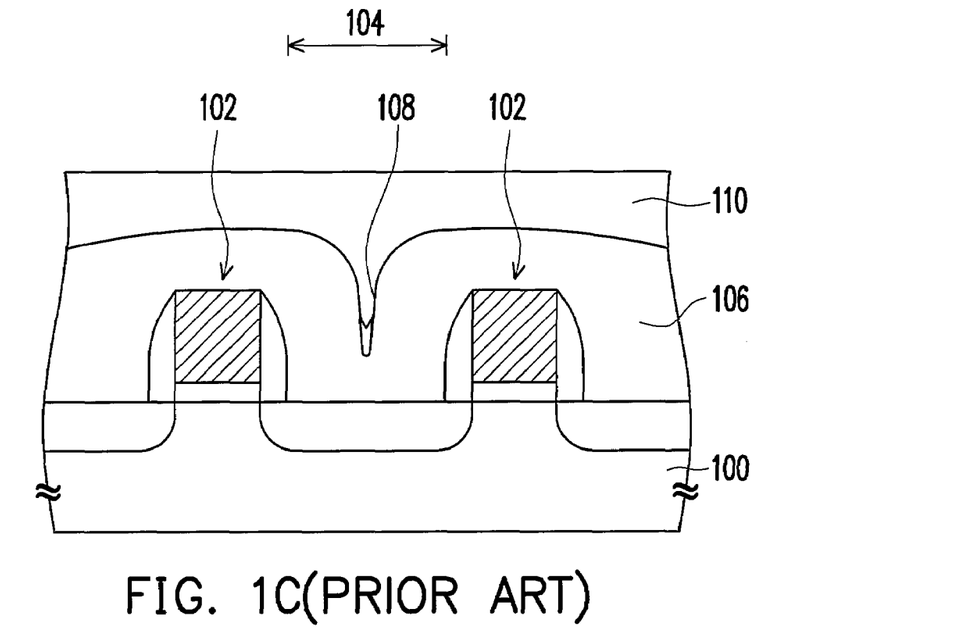
Figure 2:
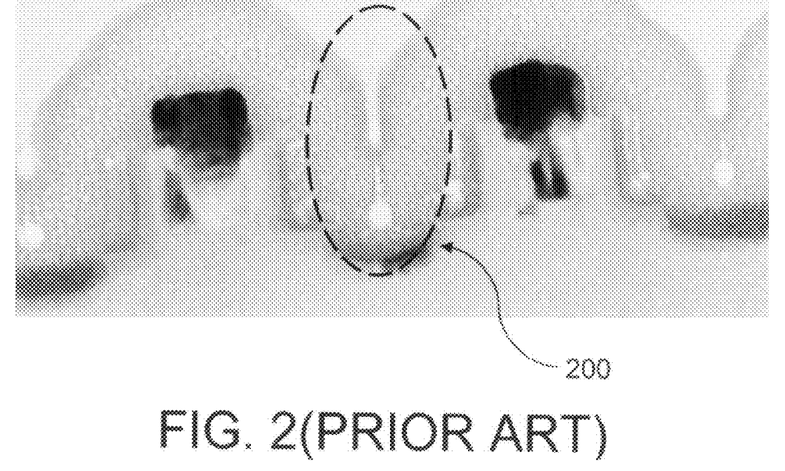
FIG. 2 is a picture taken by transmission electronic microscopy, which demonstrates a silicon nitride layer having a seam generated therein according to the prior art.

Referring to FIG. 1C, a dielectric layer 110 is formed above the silicon nitride layer 106. Since seam is formed in the silicon nitride layer 106, the dielectric layer 110 fails to cover the silicon nitride layer 106 completely. Only a portion of the seam 108 is filled with the dielectric layer 110. As shown in the picture taken by transmission electron microscopy as shown in FIG. 2, at the region depicted by the reference number 200, the seam 108 in the silicon nitride layer 106 is not completely filled with the dielectric layer 110.

Figure 1D:
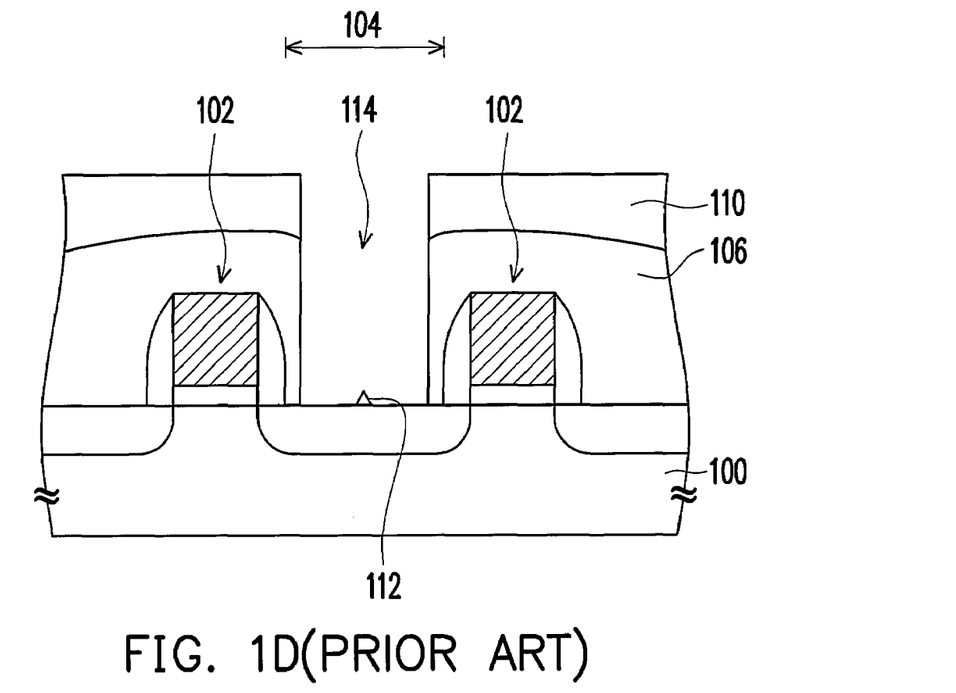
Figure 3:
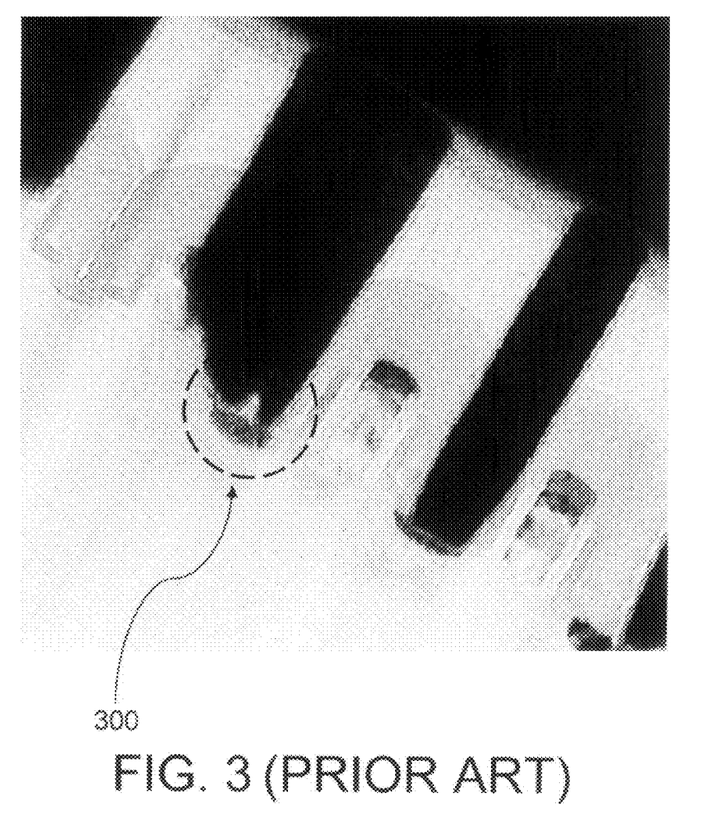
FIG. 3 is a picture taken by transmission electronic microscopy, which demonstrates residues generated at the bottom of a contact opening according to the prior art.

Thereafter, as shown in FIG. 1D, an etching process is performed to form a contact in the dielectric layer 110 and the silicon nitride layer 106. Due to the presence of seam 108 in the silicon nitride layer 106, after the etching of the dielectric layer 110 and the silicon nitride layer 106, residues 112 are formed at the bottom of the contact opening 114 as shown by the reference number 300 in the picture taken by transmission electron microscopy in FIG. 3.

Figure 1E:
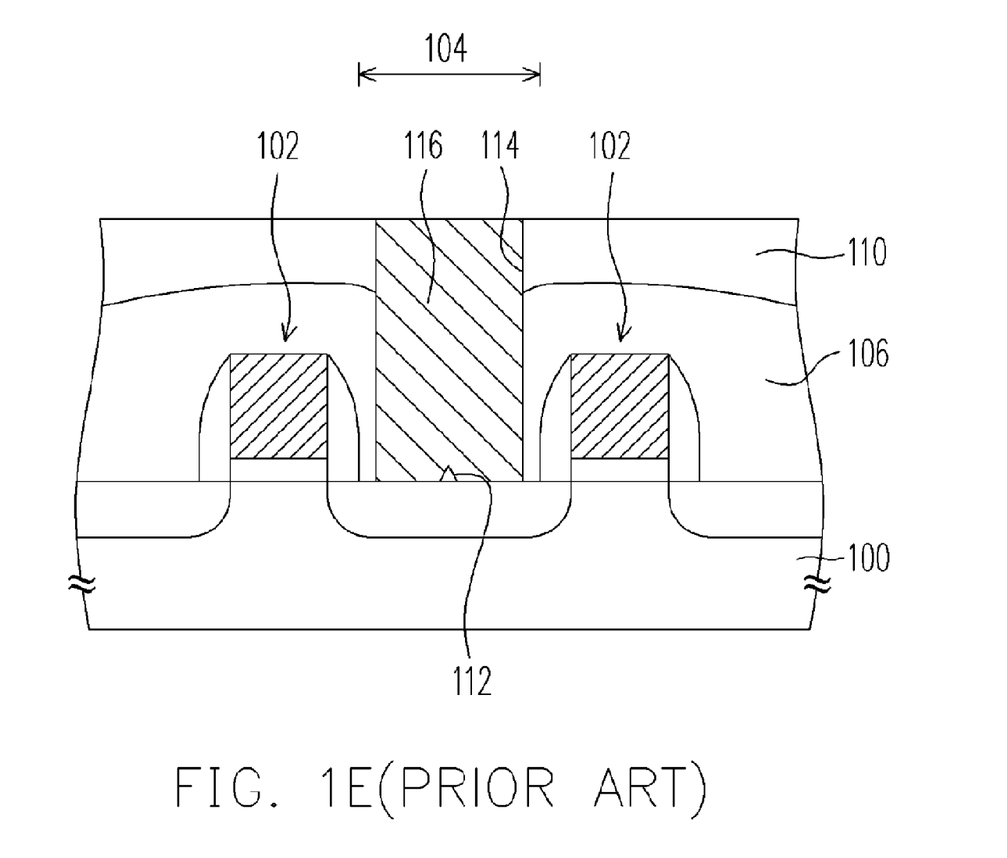

Continuing to FIG. 1E, the contact opening 114 is then filled with a metal material to form a contact 116. The residues 112 at the bottom of the contact opening 114 increase the resistance of the contact 116. A short circuit may even generate between the contact 116 and the metal oxide semiconductor device 102 to affect the reliability and efficiency of the device.

Accordingly, the development of a technology that can apply a silicon nitride layer to generate stress to increase the device efficiency, while the generation of defects in the film layer is obviated during the fabrication of the silicon nitride layer is urgently in demand.

SUMMARY OF THE INVENTION

Accordingly, the present invention provides a method of fabricating a contact, wherein defects in the film layer resulting in the generation of residues in the contact opening to affect the efficiency of devices is prevented.

The present invention also provide a semiconductor device, wherein the stress layer has a sufficient thickness to prevent the generation of seam in order to enhance the efficiency of the device.

The present invention further provides a method of fabricating a contact, wherein the method includes providing a substrate having at least two metal oxide semiconductor devices formed thereon. The two metal oxide semiconductor devices have a gap in between. A first stress layer is formed over the substrate, covering the two metal oxide semiconductor devices and the substrate. The first stress layer is formed by forming a stress material layer above the substrate covering the two metal oxide semiconductor devices and filling the gap therebetween. The stress material layer formed inside the gap has a seam therein. An etching back process is performed to remove a portion of the stress material layer inside the gap. The width of the seam formed in the stress material layer is thereby expanded. A second stress layer is then formed on the first stress layer. A dielectric layer is further formed on the second stress layer, followed by removing a portion of the dielectric layer, a portion of the first stress layer and a portion of the second stress layer inside the gap until a part of the substrate surface is exposed. A contact opening is thereby formed. The contact opening is then filled with a conductive layer to form a contact.

According to an embodiment of the present invention, before the formation of the second stress layer, the formation of the first stress layer is performed for at least one time.

According to an embodiment of the present invention, the material of the first stress material layer includes but not limited to silicon nitride, and the first stress material layer is formed by plasma enhanced chemical vapor deposition (PECVD). The material of the second stress material includes but not limited to silicon nitride, and the second stress material layer is formed by plasma enhanced chemical vapor deposition (PECVD)

According to the above embodiment of the present invention, the total stress of the first stress layer and the second stress layer is between 1 to 50 GPa, for example. More preferably, the total stress of the first stress layer and the second stress layer is between 1 to 10 GPa.

According to the above embodiment of the present invention, the etching back process is a dry etching process or a wet etching process, for example.

According to the above embodiment of the present invention, the material of the above dielectric layer includes, but not limited to, silicon oxide, phosphorous silicon glass, borosilicate glass, boron phosphorous silicon glass, or undoped silicon glass/phosphorus silicon glass.

The present invention further provides a semiconductor device which includes at least two metal oxide semiconductor devices, a first stress layer, a second stress layer, a dielectric layer and a contact. The metal oxide semiconductor devices are disposed on a substrate, and between neighboring semiconductor devices also include a gap. A first stress layer is disposed over the substrate, covering the metal oxide semiconductor devices and filling the gap. A second stress layer is disposed above the first stress layer. The dielectric layer is disposed above the second stress layer. The contact is disposed in the dielectric layer, the second stress layer and the first stress layer inside the gap. The contact is electrically connected with the metal oxide semiconductor devices.

According to an embodiment of the present invention, the first stress layer includes at least a stress material layer, for example, a silicon nitride layer. The second stress layer is a silicon nitride layer, for example.

According to an embodiment of the present invention, the total stress of the first stress layer and the second stress layer is between 1 to 50 GPa. More preferably, the total stress of the first stress layer and the second stress layer is between 1 to 10 GPa.

According to an embodiment of the present invention, the total thickness of the above-mentioned first stress layer and the second stress layer is between 150 to 1500 angstroms.

According to an embodiment of the present invention, a material of the dielectric layer includes phosphorous silicon glass, borosilicate glass, boron phosphorous silicon glass, or undoped silicon glass/phosphorus silicon glass, for example.

The present invention uses a multi-step method to form the stress layer, wherein the multi-step method includes the formation of at least the first stress layer, followed by a deposition of the second stress layer to form the stress layer. The formation of the first stress layer includes performing at least the deposition process of the stress material layer once and performing at least the etching back process once to remove a portion of the stress layer. The width of the seam in the stress material layer is thereby expanded. Accordingly, the present invention can obviate the formation of seam in the stress layer and the subsequent residue formation at the bottom of the contact opening to maintain the reliability of the process and the efficiency of the device.

Several exemplary embodiments of the invention will now be described in detail with reference to the accompanying drawings. It is to be understood that the foregoing general description and the following detailed description of preferred purposes, features, and merits are exemplary and explanatory towards the principles of the invention only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts. It is to be understood that both the foregoing general description and the following detailed description are exemplary, and are intended to provide further explanation of the invention as claimed.

FIGS. 4A to 4F are schematic, cross-sectional views showing the steps for fabricating a contact according to an embodiment of the present invention.

Figure 4A:
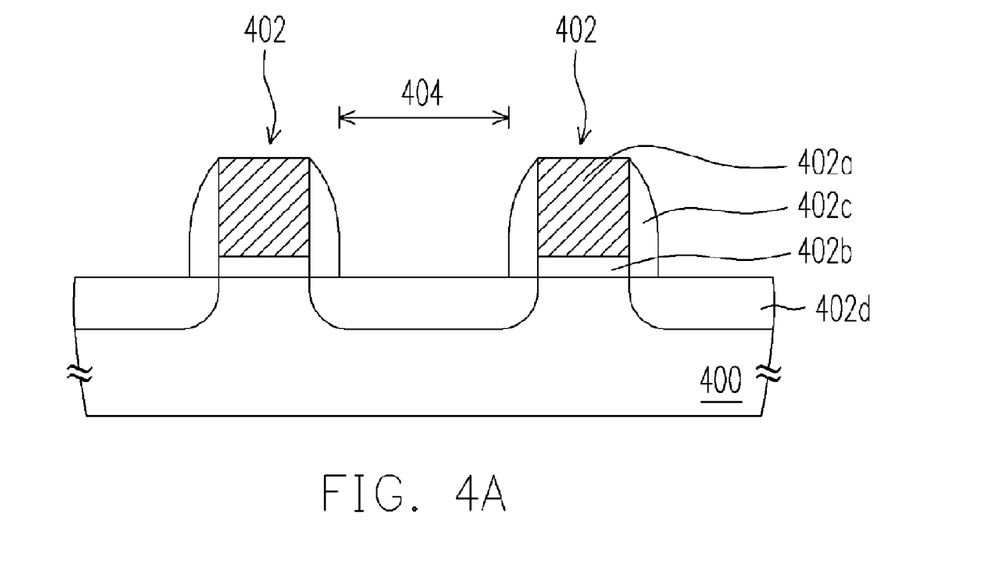
FIGS. 4A to 4F are schematic, cross-sectional views showing the steps for fabricating a contact according to an embodiment of the present invention.

Referring to FIG. 4A, a substrate 400 having at least two metal oxide semiconductor devices 402 is provided, and there is a gap in between the two neighboring metal oxide semiconductor devices 402. The metal oxide semiconductor device 402 is formed with a gate 402a, a gate dielectric layer 402b, a spacer 402c and source/drain regions 402d, for example. The gate 402a and the source/drain regions 402d of the metal oxide semiconductor devices may further include metal silicide thereon. The parts and the fabrication method thereof of the metal oxide semiconductor device 402 are well known to those skilled in the art and will not be reiterated herein.

A stress layer is then formed over the substrate 400. The stress at the channel region of the metal oxide semiconductor devices 402 is thereby increased to increase the drive current of the device and to enhance the efficiency of the device. The stress value of the stress layer is highly related to the thickness of the film. If the thickness of the stress layer is increased, its stress value increases accordingly. The drive current of the device is thus higher to increase the efficiency of the device.

Figure 5:
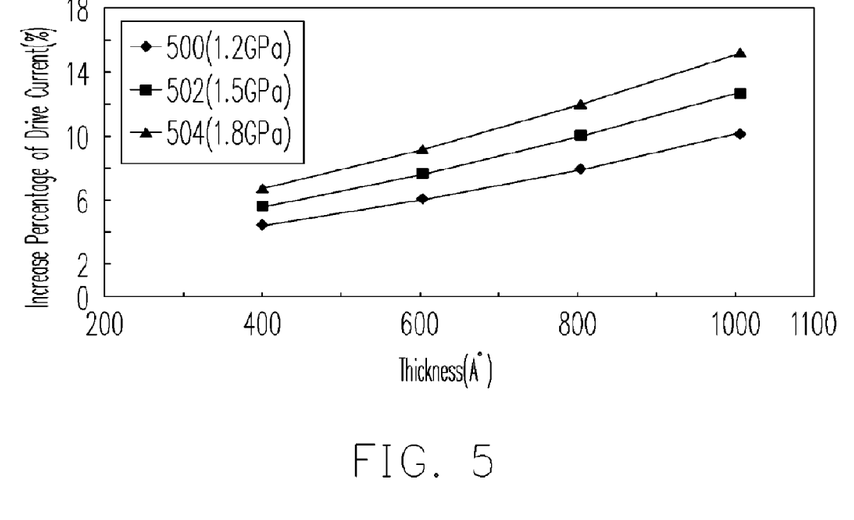
FIG. 5 is a diagram illustrating the relationship between the increase percentage of drive current and the thickness of the stress layer.

FIG. 5 illustrates the relationship between the thickness of the stress layer and the efficiency of the device. Referring to FIG. 5, FIG. 5 illustrates the relationship between ion gain percentage of the drive current of a device and thickness (in angstroms) of a stress layer. In FIG. 5, the curves 500, 502 and 504 respectively represent the stress layers with the stress values of 1.2 GPa, 1.5 GPa and 1.8 GPa, and the thicknesses of the stress layers are between 400 to 1000 angstroms. As shown in the curves 500, 502, 504 in FIG. 5, under a fixed stress value, the stress layer with a greater thickness, the increase percentage of the drive current of the device is higher. In other words, the drive current is higher, and the device efficiency is better.

Accordingly, the efficiency of a device is highly related to the thickness of the stress layer. To enhance the efficiency of a device, a thicker stress layer is normally formed to increase its stress value. As a result, the problems of seam being generated in the stress layer to affect the subsequent manufacturing process as in the prior art can be obviated.

Figure 4B:
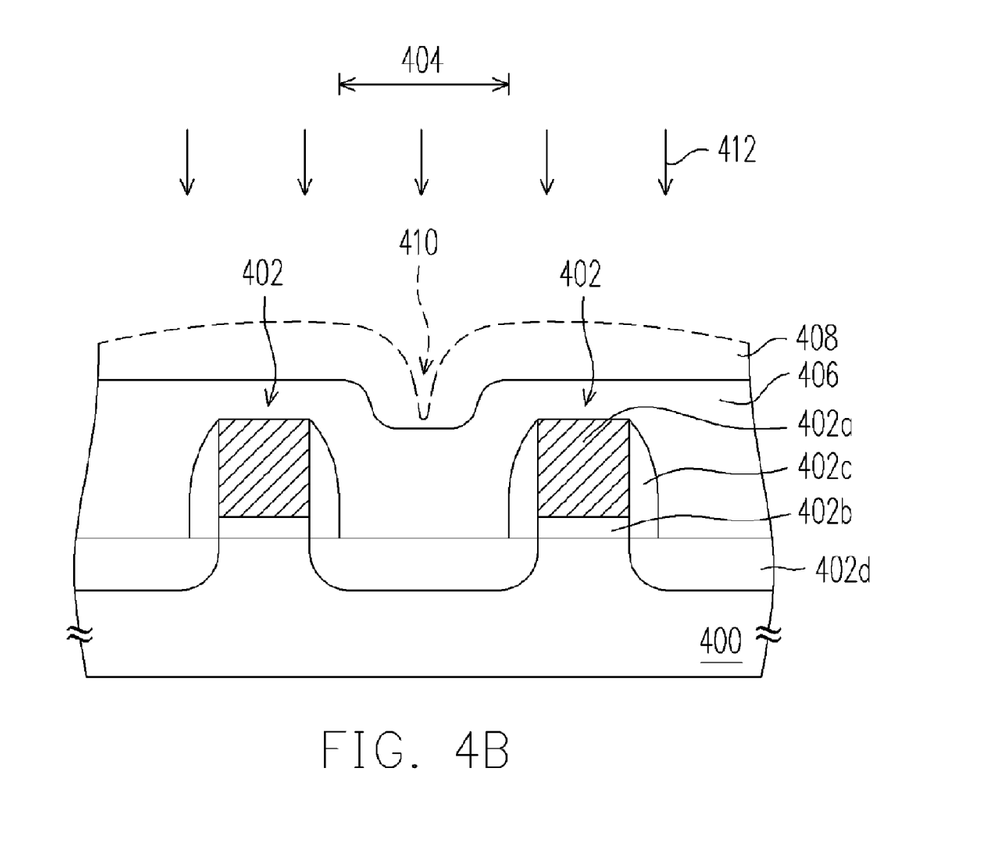
Figure 4C:
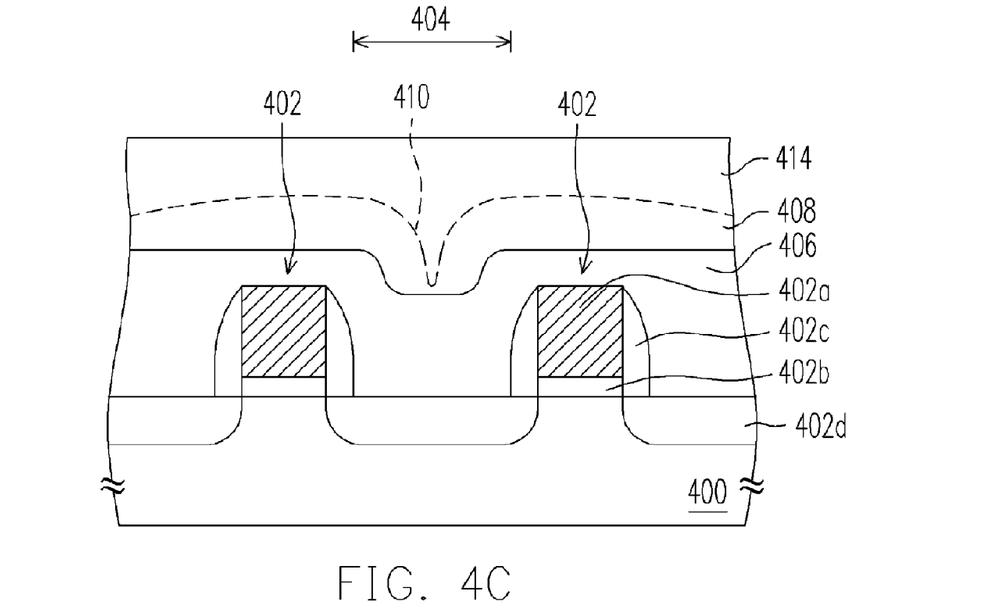

The present invention relies on a multi-step method to form a stress layer in which the presence of seam which can affect the efficiency and reliability of a device is prevented. FIG. 4B through 4C illustrate the multi-step method in forming a stress layer according to an embodiment of the present invention.

Referring to FIG. 4B, a first stress layer is formed above the substrate 400, wherein the first stress layer covers the entire substrate 400 and the metal oxide semiconductor devices 402, and fills the gap between the metal oxide semiconductor devices 402. The first stress layer 406 is formed by forming a stress material layer 408 above the substrate to cover the two metal oxide semiconductor devices 402 and to fill the gap therebetween. Further, the stress layer 408 that forms in the gap has a seam therein. The above stress layer 408 is formed by, for example, plasma enhanced chemical vapor deposition or other appropriate methods. The material of the stress layer includes silicon nitride or other appropriate materials, for example. An etching back process 412 is then performed to remove a portion of the stress layer 408 inside the gap 404 to expand the width of the seam in order to allow a complete filling of the seam with the subsequently deposited film layer when the first stress layer 406 is formed. The etching back process 412 can be a dry etching process or a wet etching process, for example.

Referring to FIG. 4C, a second stress layer 414 is formed on the first stress layer 406. The second stress layer 414 is formed by plasma enhanced chemical vapor deposition or other appropriate methods. The material of the stress layer includes material such as silicon nitride or other appropriate materials. The total stress of the first stress layer 406 and the second stress layer 414 is between 1 to 50 GPa, for example. Preferably, the total stress of the first stress layer 406 and the second stress layer 414 is between 1 to 10 GPa. The total thickness of the first stress layer 406 and the second stress layer 414 is between 150 to 1500 angstroms.

Figure 6:
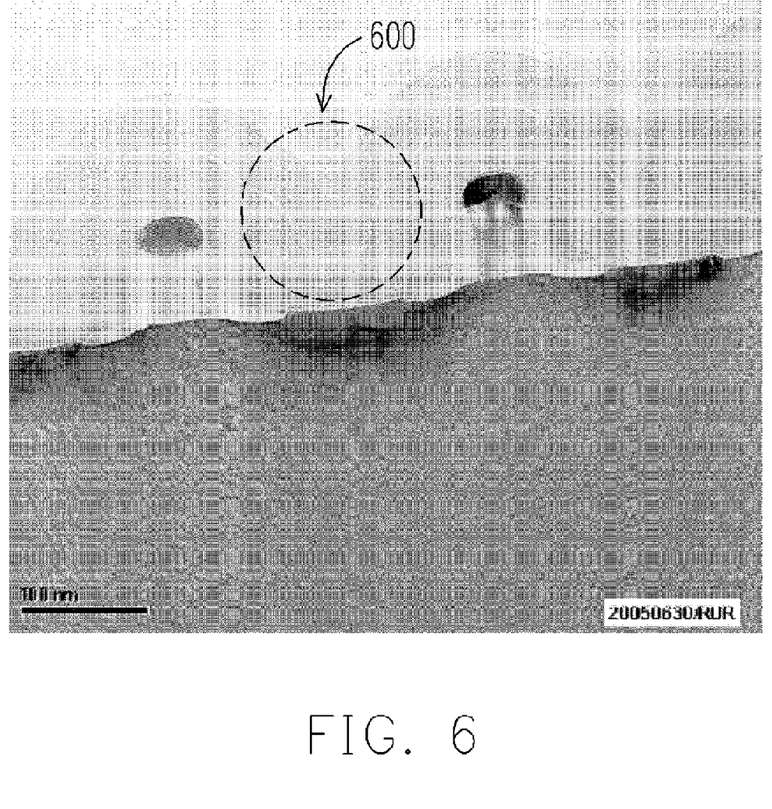
FIG. 6 a picture taken by transmission electronic microscopy of a semiconductor device of the present invention.

The above multi-step method in forming the stress layer (the first stress layer 406 and the second stress layer 414) includes a deposition-etching back-deposition method, for example. The stress layer (the first stress layer 406 and the second stress layer 414) of the present invention is formed by using plasma enhanced chemical vapor deposition to form a silicon nitride layer of about 700 angstroms on a substrate 400 as a first stress layer. Moreover, seam 410 is generated in the first stress layer 406 in the gap 404. The etching back process 412 is then performed to remove about 200 angstroms thick of the stress layer 406 inside the gap 404 to expand the width of the seam 410. Thereafter, plasma enhanced chemical vapor deposition is further performed to form a silicon nitride layer of about 500 angstrom thick as a second stress layer on the first stress layer 406. More particularly, as depicted by reference number 600 in a picture taken with transmission electron microscopy as shown in FIG. 6, the problem of generating seam in a stress layer can be prevented according to the present invention.

In another embodiment, before forming the second stress layer 414, the step of forming the first stress layer 406 can be repeated for at least one time, for example. In this embodiment, the formation of the first stress layer 406 is performed twice. For example, a stress material layer (not shown) is formed on the substrate 400, covering the two metal oxide semiconductor devices 402 and filling the gap therebetween. The material layer that is formed inside the gap 404 has a seam therein. An etching back process is then performed to remove a portion of the stress material layer inside the gap 404 to expand the width of the gap. Thereafter, another stress material layer (not shown) is formed on the stress material layer. Another etching back process is performed to remove a portion of the stress material layer inside the gap 410. The formation of the first stress layer is thereby completed.

Accordingly, the multi-step method of performing the step of forming the first stress layer 406 twice followed by forming the second stress layer 414 relies on a deposition-etching back-deposition-etching back-deposition method. For example, plasma enhanced chemical vapor deposition method is first performed to form a silicon nitride layer of about 400 angstroms thick. Moreover, seam is generated in the silicon nitride layer inside the gap 404. An etching back process is then performed to remove about 200 angstroms thick of the silicon nitride layer inside the gap to expand the width of the seam. Plasma enhanced chemical vapor deposition is further performed to form another silicon nitride layer of about 400 angstroms thick on the silicon nitride layer. Another etching back process is performed to remove about 200 angstroms thick of the silicon nitride layer inside the gap 410 to form the first stress layer 406. Plasma enhanced chemical vapor deposition is again performed to form a silicon nitride layer of about 400 angstroms thick as a second stress layer 414.

The present invention does not limit the number of times the multi-step method is being repeated to form the stress layer. In other words, the number of times in forming the first stress layer 406 is not being limited and can be adjusted according to the demand of the process.

Figure 4D:
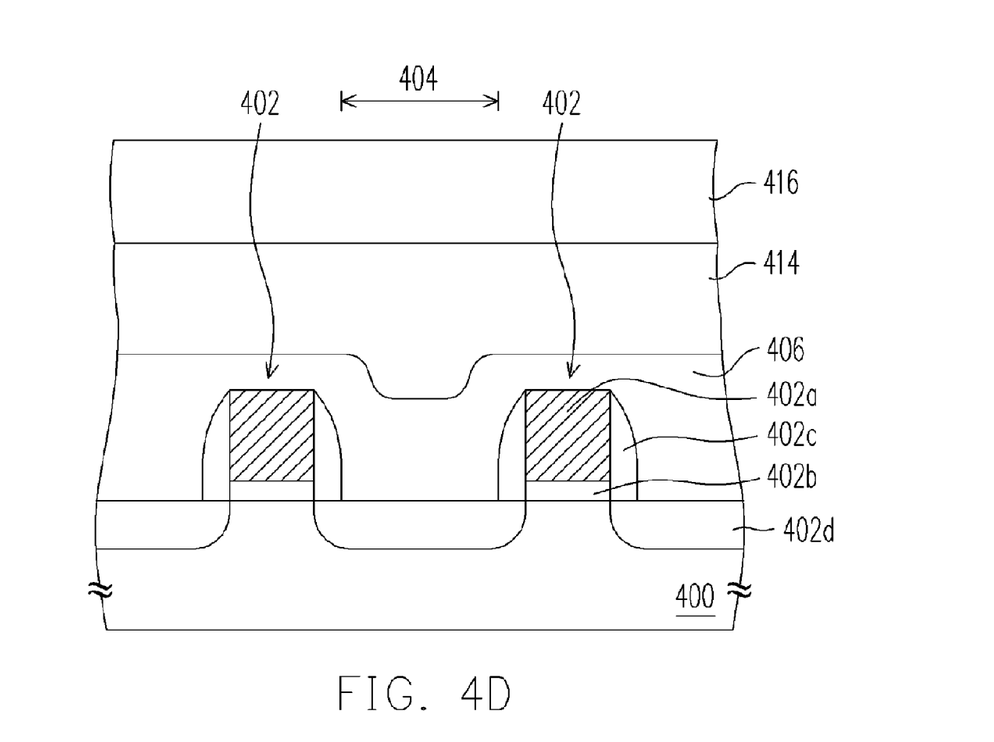

Thereafter, as shown in FIG. 4D, a dielectric layer is formed on the second stress layer 414, wherein the dielectric layer 416 is formed with an undoped silicon glass layer and a phosphorous silicon glass layer. The dielectric layer is formed by, for example, performing sub-atmospheric chemical vapor deposition to form an undoped silicon glass layer on the second stress layer 414, followed by forming a phosphorous silicon glass layer on the undoped silicon glass layer using tetraethylorthosilicate (TEOS) as a reaction gas source. Other materials for forming the dielectric layer 416 include but not limited to, silicon oxide, phosphorous silicon glass, boron silicon glass, boron phosphorous silicon glass. The dielectric layer 416 is formed by chemical vapor deposition or other appropriate methods, for example.

Figure 4E:
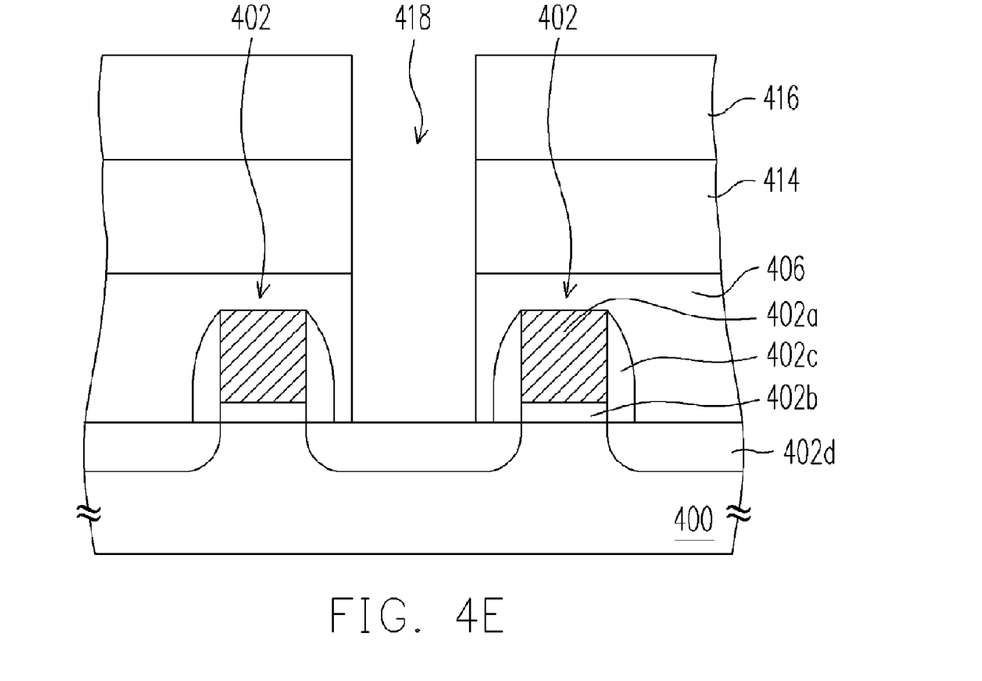

Continuing to FIG. 4E, a portion of the dielectric layer 416, a portion of the first stress layer 414 and a portion of the second stress layer 406 inside the gap 404 are removed to expose a portion of the substrate 400 surface to form a contact opening 418. The contact opening 418 is formed by an etching process, for example.

Figure 4F:
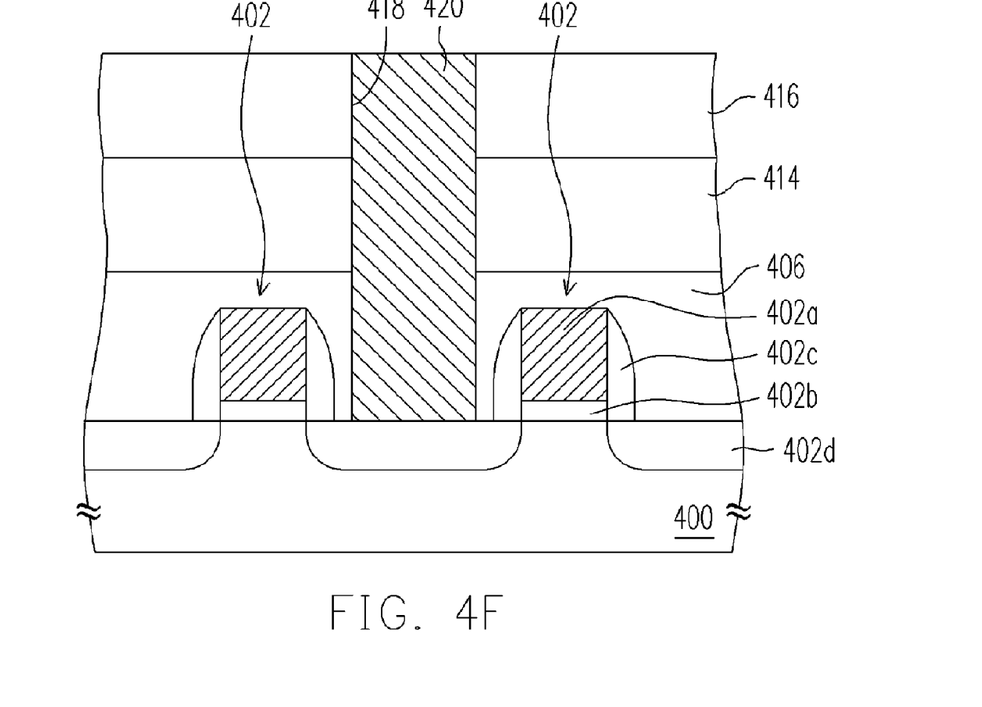

Referring to FIG. 4F, the contact opening 418 is then filled with a conductive layer to form a contact 420. The material of the above-mentioned conductive layer includes doped polysilicon or tungsten, for example. The conductive layer is formed by chemical vapor deposition, for example.

It is worthy to note that using a multi-step method to form the stress layer (the first stress layer 406 and the second stress layer 414) according to the present invention, the generation of seam in the stress layer as in the prior art leading to the formation of residues at the bottom of the contact opening to affect the efficiency and the reliability of the device, can be prevented The following disclosure details the semiconductor device formed according to the present invention.

Referring again to FIG. 4F, the semiconductor device of the present invention includes at least two metal oxide semiconductor devices 402, a first stress layer 406, a second stress layer 408, a dielectric layer 416 and a contact 420. The two metal oxide semiconductor devices 402 are disposed on the substrate 400, and the two metal oxide semiconductor devices 402 have a gap 404 therebetween. The first stress layer 406 is disposed above the substrate 400, covering the metal oxide semiconductor devices 402 and filling the gap 404. The first stress layer includes at least, for example, a layer of stress material layer or a multi-layer of stress material layer. The material of the first stress layer includes silicon nitride, for example, or other appropriate stress material layers. Further, the second stress layer 408 is disposed on the first stress layer 406. The material of the second stress layer 408 includes silicon nitride, for example, or other appropriate stress material layers. The total stress of the first stress layer 406 and the second stress layer 408 is between 1 to 50 GPa, for example. Preferably, the total stress of the first stress layer 406 and the second stress layer 408 is between 1 to 10 GPa. The total thickness of the first stress layer 406 and the second stress layer 408 is between 150 to 1500 angstroms. Further, the dielectric layer 416 is disposed above the second stress layer 408, and the material of the dielectric layer 416 includes but not limited to silicon oxide, phosphorous silicon glass, boron silicon glass, boron phosphorous silicon glass or undoped silicon/phosphorous silicon glass. The contact 420 is disposed in a part of the dielectric layer 416, the second stress layer 408 and the first stress layer 406 inside the gap, and is electrically connected with the metal oxide semiconductor devices 402.

According to the present invention, using the multi-step method in forming the stress layer can prevent the generation of seam in the stress layer. The problems of generating residues in the subsequently formed contact opening, resulting in an increase of the contact resistance and even a short circuit to adversely affect the reliability of the process and the efficiency of the device can be obviated.

The multi-step method in forming the stress layer of the present invention is a deposition-etching back-deposition method. Therefore, no additional photomask is required to increase the manufacturing cost while a thicker stress layer is formed to increase the efficiency of the device and to prevent the generation of seam in the stress layer to affect the reliability of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a contact, the method comprising:
   providing a substrate having at least two metal oxide semiconductor devices already formed thereon, wherein the two metal oxide semiconductor devices comprise a gap therebetween;
   forming a first stress layer over the substrate to cover the two metal oxide semiconductors, wherein the first stress layer is formed by:
      forming a stress material layer over the substrate to cover the two metal oxide semiconductor devices and to fill the gap, wherein the stress material layer inside the gap comprises a seam; and
      performing an etching process to remove a portion of the stress material layer inside the gap to expand a width of the seam;
   forming a second stress layer on the first stress layer;
   forming a dielectric layer on the second stress layer;
   removing a portion of the dielectric layer, a portion of the first stress layer and a portion of the second stress layer inside the gap to expose a portion of a surface of the substrate to form a contact opening; and
   filling a conductive layer in the contact opening.

2. The method of claim 1, wherein before the step of forming the second stress layer, the step of forming the first stress layer is repeated for at least one time.

3. The method of claim 1, wherein a material of the stress material layer comprises silicon nitride.

4. The method of claim 1, wherein the step in fanning the stress material layer comprises performing plasma enhanced chemical vapor deposition.

5. The method of claim 1, wherein a material of the second stress layer comprises silicon nitride.

6. The method of claim 1, wherein the step in fanning the second stress material comprises performing plasma enhanced chemical vapor deposition.

7. The method of claim 1, wherein a total stress of the first stress layer and the second stress layer is about 1 to 50 Gpa.

8. The method of claim 1, wherein a total stress of the first stress layer and the second stress layer is about 1 to 10 GPa.

9. The method of claim 1, wherein a total thickness of the first stress layer and the second stress layer is about 150 to 1500 angstroms.

10. The method of claim 1, wherein the etching back process includes a dry etching process or a wet etching process.

11. The method of claim 1, wherein a material in constituting the dielectric layer is selected from the group consisting of silicon oxide, phosphorous silicon glass, boron silicon glass, boron phosphorous silicon glass and undoped silicon glass/phosphorous silicon glass.

* * * * *